United States Patent [19]
Berger

[11] Patent Number: 4,704,551
[45] Date of Patent: Nov. 3, 1987

[54] LOW VOLTAGE/HIGH VOLTAGE FIELD EFFECT TRANSISTOR (FET) SWITCHING CIRCUIT FOR PRINTED CIRCUIT BOARD TESTER

[75] Inventor: James K. Berger, Malibu, Calif.

[73] Assignee: Methode of California, Chatsworth, Calif.

[21] Appl. No.: 879,409

[22] Filed: Jun. 27, 1986

[51] Int. Cl.[4] .................... H01L 9/02; H03K 17/687; H03K 19/02; H03K 19/00
[52] U.S. Cl. ............................... 307/575; 307/200 B; 307/246; 307/473; 307/584
[58] Field of Search ............... 307/200 B, 440, 451, 307/473, 475, 246, 577, 584, 573, 264

Primary Examiner—Stanley D. Miller
Assistant Examiner—M. R. Wambach
Attorney, Agent, or Firm—Keith D. Beecher

[57] ABSTRACT

A high voltage switching circuit for a printed circuit board tester, or the like, utilizing field effect transistor (FET) switches which are controlled by CMOS logic circuitry, which incorporates a voltage level shifter circuit for high voltage switching operations, and which performs its switching functions with a minimum of FET's and associated elements, as compared with similar switching circuits in the prior art.

3 Claims, 3 Drawing Figures

LOW VOLTAGE/HIGH VOLTAGE FIELD EFFECT TRANSISTOR (FET) SWITCHING CIRCUIT FOR PRINTED CIRCUIT BOARD TESTER

BACKGROUND OF THE INVENTION

It is often necessary to operate different sections of an electronic circuit at different voltage levels. Such a necessity arises, for example, in printed circuit board testers in which the test points of the printed circuit board are switched to a high voltage bus by FET switches controlled by low voltage CMOS logic.

Likewise, in other systems, the need often arises to interconnect logic elements from different logic families, or to interconnect logic elements operated at different supply potentials. This need is met by the use of voltage level shifters, and a simplified voltage level shifter incorporating the concept of the invention used the switching circuit of the present invention to switch a printed circuit board test point, for example, to a voltage bus of the order of 100–500 volts, under the control of CMOS logic operating at a voltage level of from 0–10 volts.

As pointed out in U.S. Pat. No. 4,538,104, the General Electric Company introduced the first printed circuit board in-circuit tester over thirty (30) years ago. The in-circuit tester is designed to analyze the individual components on the printed circuit board. In this test, multiple probes are connected to a circuit analyzer at one end, and are all respectively connected to the test points of a printed circuit board at the other end. These probes are then switched individually to buses extending to the circuit analyzer, and which are known as the "TO" bus and the "FROM" bus. It is usual in present day test circuits for the "FROM" bus, for example, to be operated in a voltage range of from 100 to 500 volts, and for the "TO" bus to operate essentially at ground potential.

In actual test equipment, the switches used in the in-circuit testers are usually field effect transistors (FETS), and the FETS are operated by low voltage CMOS logic. There is no problem in switching the printed circuit board test points to the "TO" bus, because that bus is operated near ground potential, which is in the same voltage range as the voltage of the CMOS logic operating the particular FETS. However, problems arise in operating the FETS connecting the test points to the "FROM" bus, because, as mentioned, the "FROM" bus operates in a voltage range of 100–500 volts.

An objective of the present invention is to provide an improved and simplified voltage level shifting circuit which permits CMOS logic effectively to control the FET switches which connect the test point to the high voltage "FROM" bus.

BRIEF DESCRIPTION OF THE DRAWINGS

FIG. 1 shows a single test point of a printed circuit board which is connected to the "FROM" bus to the "TO" bus of a printed circuit tester through respective switches SW1, SW2. The "FROM" bus is usually operated at a voltage of from 100–500 volts. The "TO" bus is usually operated at or near ground potential. There are additional switches in the circuit, as described in copending application Ser. No. 879,410, assigned to the present assignee, because each of the buses include force and sense lines. However, only the switches SW1, SW2 shown in FIG. 1, which connect the test point to the force lines of the buses need be considered for an understanding of the circuit of the present invention.

When switch SW1 is closed, the test point is pulled up to a voltage in a range of 100–500 volts. Conversely, when switch SW2 is closed, the test point is pulled down to around ground potential.

It is preferable to implement switches SW1 and SW2 with field effect transistors (FETs) because of their low leakage and their ability to handle high voltages. Unlike bipolar transistors, no leakage current flows in the FET from the gate back into the source-drain circuit. This is important in the case of printed circuit board testers because current flow in the source-drain circuit is used to measure component values, and any leakage currents would cause measurement errors.

Figure 1:
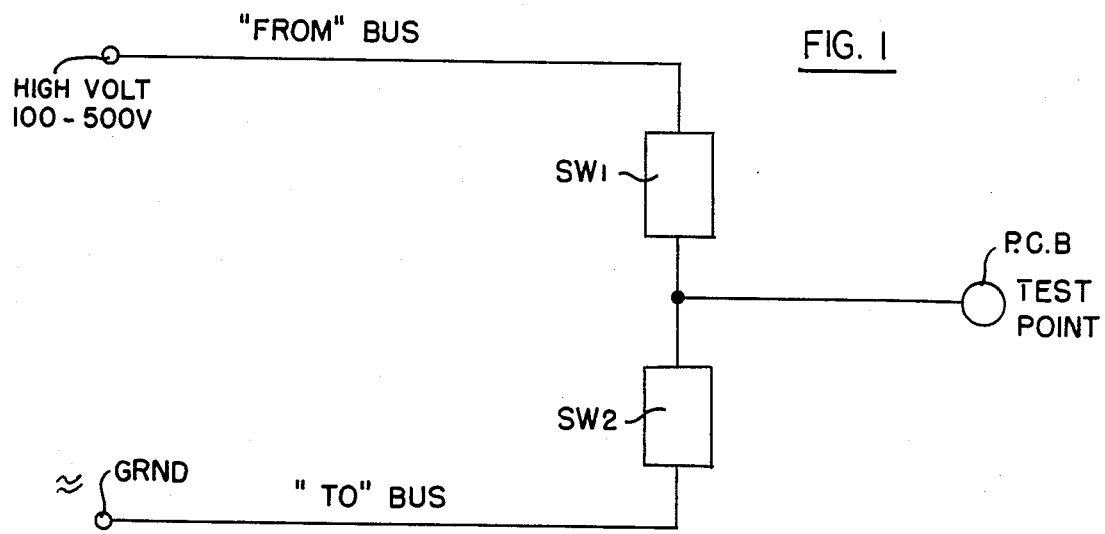
FIG. 1 is a schematic representation of the manner in which a test point of a printed circuit board is switched to the "TO" bus and to the "FROM" bus in printed circuit test equipment.
Figure 2:
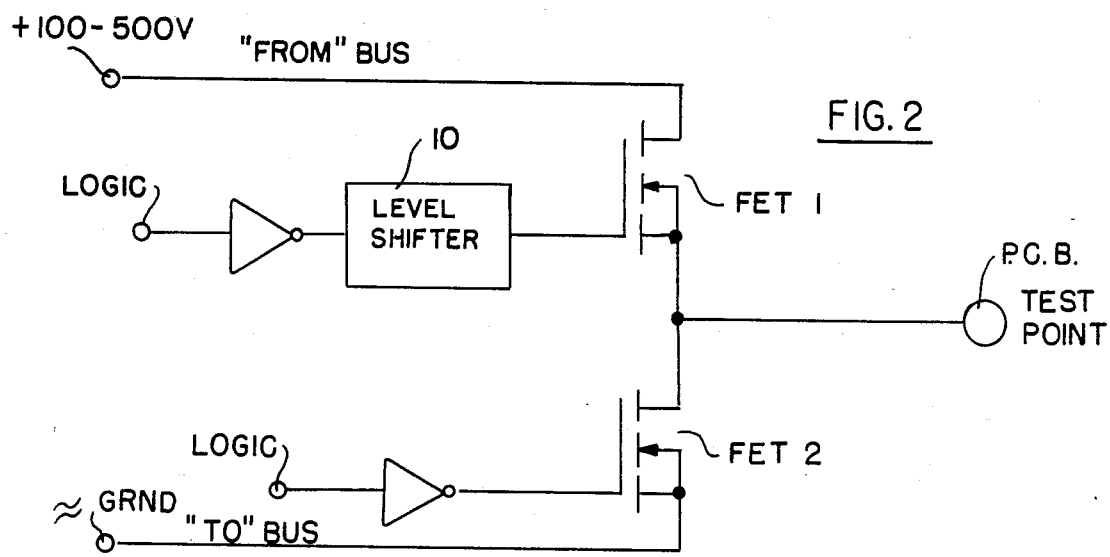
FIG. 2 is a schematic representation of the manner in which the switches are controlled, when FETs are used to perform the switching function.

The circuit of FIG. 2 shows the manner in which the FETs, FET 1 and FET 2, are controlled by CMOS logic, when the switches SW1 and SW2 are implemented by FETs. FET 1 is shown as connecting the test point to the "FROM" bus, and FET 2 is shown as connecting the test point to the "TO" bus.

The FETs are controlled by appropriate CMOS logic, as mentioned above. However, because CMOS logic usually operates in a range of 0–10 volts, a level shifter 10 is required in the circuit of FET 1 to enable that FET to switch in the 100–500 volt range. However, no level shifter is required to the circuit of FET 2 because its switching levels are in the same range as the voltage levels of the CMOS logic.

The prior art circuits involving the control of the FET 1 through level shifter 10 are exceeding complex. Indeed, in some cases, the circuit complexity was such, that FET 1 has been replaced by opto-isolator switching circuits. However, such circuits create problems of their own. One of the drawbacks in the use of opto-isolators is that they are generally available only as discrete components and they do not lend themselves to integrated circuit construction. Another disadvantage of the opto-isolator type of switch is that it is very slow as compared with FETs. For example, FETS may be turned on and off in matter of five nano-seconds, or less; whereas, opto-isolators are three orders of magnitude greater, requiring four to five micro-seconds to turn on and off. Also, opto-isolators are difficult to construct with sufficiently low leakage to be useful in printed circuit testing apparatus. An additional factor is that there are yield problems in the manufacture of opto-isolators and they tend to fail when exposed to high voltage over a long period of time.

Figure 3:
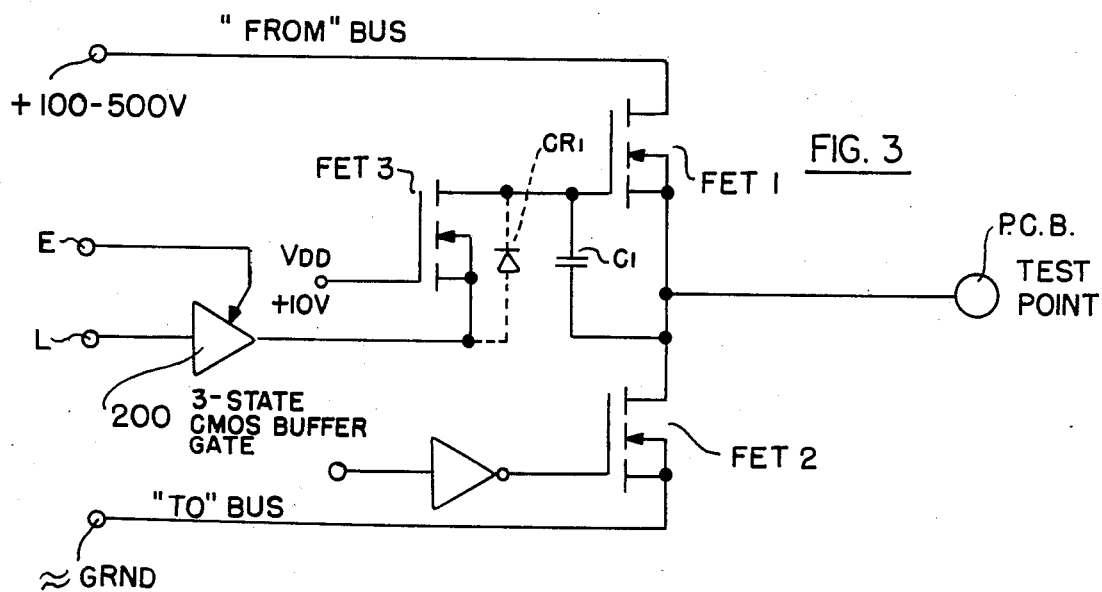
FIG. 3 is a circuit showing the switching circuit of the present invention in one of its embodiments.

Because of the above mentioned problems associated with opto-isolators, it is most important in printed circuit board testers that FETS be used for switching to the high voltage bus, and it is therefore most important that a simple and expeditious circuit be devised for controlling the FETS. The present invention provides such a circuit and system, as shown in FIG. 3.

An FET will conduct when its gate electrode is at a positive potential with respect to its source eletrode, and no current will flow back into the driving source when the FET is conductive. Rather, the entire current flow is to the drain electrode from the source electrode, and any current measured in the high voltage bus is not contaminated with leakage currents from the FET. However, as mentioned, problems arise in controlling FET 1 which connects the test point to the high voltage "FROM" bus.

For printed circuit board testing, the source voltage will be at some unknown potential depending upon the particular test involved. It may be anywhere in a range from 0–500 volts. Accordingly, it is essential to provide a voltage level shifter between the CMOS control logic and the gate of the FET connected on the "FROM" bus. The voltage level shifter must have appropriate characterisitics so that when the logic indicates that the FET is to be conductive, the level shifter must make the gate of the FET positive with respect to the source, no matter what the source voltage happens to be. Moreover, the voltage level shifter must be capable of swinging up and down with the source voltage. The opto-isolator type of circuit does have the foregoing capabilities, but is subject to the drawbacks and disadvantages described above.

As also mentioned above, prior art attempts to provide an appropriate voltage level shifter for operation in this type of circuit in conjunction with an FET have resulted in circuits of high complexities. Although these circuits, unlike the opto-isolator circuits are amenable to integration, the yield is poor because of the necessity to include a large number of elements in the integrated circuit, and the resulting integrated circuits are costly.

The circuit and system of the present invention, in the embodiment shown in FIG. 3, is relatively simple in that it involves only a tri-state CMOS buffer gate 200, an additional field effect transistor designated FET 3, and a capacitor C1. Capacitor C1 is connected between the gate and source electrodes of FET 1.

FET 1 as described above, is the field effect transistor to be controlled, and it is the FET which provides the switching between the printed circuit board test point and the high voltage "FROM" bus. The tri-state CMOS buffer gate 200 is connected to the source electrode of FET 3. The drain electrode is connected to the gate of FET 1. FET 3 includes an inherent parasitic diode between its drain and source electrodes designated CR1. The gate of FET 3 is connected to the positive terminal of a 10 volt source designated $V_{DD}$.

The internal diode CR1 is a characteristic of all field effect transistors. It is always present between the drain and source, and the polarity of the diode is such that the drain can never be negative with respect to the source, other than just the voltage drop of the diode.

In between tests, when high voltage is not present on the "FROM" bus, FET 2 is rendered conductive to connect capacitor C1 to the "TO" bus, which is established at or near ground potential.

In FIG. 3, E is the enable signal for the tri-state buffer gate 200, and L is the logic signal. After the tristate buffer 200 has been enabled, then when L is high, FET 1 will be turned on during the next cycle; and when L is low, FET 1 will be turned off in the next cycle. The tri-state buffer 200 gate is a buffer element whose output follows the input provided that it is enabled, this being achieved by E.

Accordingly, when E enables the tristate buffer 200, the output of the buffer is low when L is low, and it is high when L is high. When the output of the buffer gate 200 is high, it is at approximately 10 volts. This causes capacitor C1, whose other side is established at ground potential, to charge through the diode CR1. Accordingly, the top side of capacitor C1 is forced to plus 10 volts with respect to the negative side by the output of the tri-state buffer gate 200. After the E signal goes low again, the output of the tri-state buffer gate floats between +10 volts and 0.

The next test may now start, and when that occurs, the "FROM" bus goes positive to a voltage in the range, for example, of 100 to 500 volts. FET 1 now turns on because capacitor C1 retains its charge, and the gate of FET 1 is driven 10 volts more positive than the source. Capacitor C1 simulates a small floating power supply which always maintains the gate of FET 1 as a 10 volt voltage level more positive than the source. The diode CR1 at this time does not conduct because it is back biased, and FET 3 does not conduct because the potential at its gate and source are both at the same potential of, namely, 10 volts.

At the completion of the test, the "FROM" bus returns to ground potential and, at that time, in order to turn off FET 1, the tri-state buffer gate logic signal L is made low so that the output of the tri-state buffer is essentially at ground potential. This causes FET 3 to become conductive because its source is now at ground potential and its gate is held at +10 volts. Accordingly, FET 3 becomes fully conductive and its drain electrode is established at ground potential to cause capacitor C1 rapidly to be discharged, causing FET 1 to be non-conductive. The next time the "FROM" bus goes to a high positive potential, FET 1 will not conduct, because there is no charge on the capacitor, regardless of the potential of the test point of the printed circuit board.

Accordingly, for any particular test, capacitor C1 will maintain whatever charge was placed on it prior to the test, and the capacitor will maintain that charge throughout the test because there is no circuit through which the capacitor can discharge. Between tests, the tri-state buffer gate 200 is enabled, and the capacitor C1 is charged or discharged according to the output of the tri-state buffer as controlled by logic signal L.

If the tri-state buffer output is low, FET 3 becomes conductive and discharges capacitor C1. On the other hand, if the output of the buffer is high, then current flows through the parasitic diode CR1 to charge the capacitor to the 10 volt level.

Therefore, the charge of capacitor C1 follows the output of the tri-state buffer gate 200 between tests, and it maintains whatever charge was placed on it during the subsequent test. Accordingly, FET 1 is conditioned between tests so that it represents either a short circuit for a test effectively connecting the test point to the "FROM" bus, or it represents an open circuit during the next test between the test point and the "FROM" bus, all under the control of the state of logic signal L.

Capacitor C1, as well as all the other circuit elements, may be in discrete form or may be in integrated circuit form. The value of capacitor C1 may be less than 100 picofarads and therefore suitable for integration.

The invention provides, therefore, a simple switching circuit by which CMOS logic operating, for example, in the 0–10 range is able to provide an effective control for an FET operating, for example, in a 0–500 volt range.

It will be appreciated that while a particular embodiment of the invention has been shown and described, modifications may be made. It is intended in the claims to cover all modifications which come within the true spirit and scope of the invention.

I claim:

1. A switching circuit for effectively connecting a test point to a high voltage source, under control of a low voltage logic signal, said switching circuit including: a first field effect transistor having its drain electrode connected to said high voltage source, and its source electrode connected to said test point; a capacitor connected between the gate electrode of the first field effect transistor and said source electrode; means connected to said source electrode for establishing said source electrode at a reference potential near the lowest potential of said low voltage logic signal; a second field effect transistor having its drain electrode connected to the gate of the first field effect transistor, having its gate electrode connected to a low voltage source, and having a diode connected between its drain and source electrodes; and a buffer gate connected to the source electrode of said second field effect transistor and responsive to a logic signal for charging said capacitor to a predetermined potential value when said logic signal is in a first logic state, and for discharging said capacitor when said logic signal is in a second logic state.

2. The switching circuit defined in claim 1 in which said means for establishing said source electrode of said first field effect transistor at a reference potential comprises a third field effect transistor switch.

3. The switching circuit defined in claim 1, in which all the circuit elements are in integrated circuit form.

* * * * *